United States Patent [19]

Stahlhofen

[11] 4,407,926
[45] Oct. 4, 1983

[54] LIGHT-SENSITIVE MIXTURE COMPRISING O-NAPHTHOQUINONE-DIAZIDES AND LIGHT SENSITIVE COPYING MATERIAL PREPARED THEREFROM

[75] Inventor: Paul Stahlhofen, Wiesbaden, Fed. Rep. of Germany

[73] Assignee: Hoechst Aktiengesellschaft, Frankfurt am Main, Fed. Rep. of Germany

[21] Appl. No.: 320,489

[22] Filed: Nov. 12, 1981

[30] Foreign Application Priority Data

Nov. 21, 1980 [DE] Fed. Rep. of Germany ....... 3043967

[51] Int. Cl.³ ..................... G03C 1/54; C07C 113/00
[52] U.S. Cl. .................................. 430/165; 260/141; 430/190; 430/192; 430/193
[58] Field of Search ............... 430/193, 190, 192, 165; 260/141 D

[56] References Cited

U.S. PATENT DOCUMENTS

| | | | |
|---|---|---|---|
| 3,046,120 | 7/1962 | Schmidt et al. | 430/190 |
| 3,635,709 | 1/1972 | Kobayashi | 430/190 |
| 3,802,885 | 4/1974 | Lawson et al. | |
| 4,105,450 | 8/1978 | Schinozaki et al. | 430/193 |
| 4,197,128 | 4/1980 | Watanabe et al. | 430/193 |
| 4,275,139 | 1/1981 | Stahlhofen | 430/165 |
| 4,306,011 | 12/1981 | Uehara et al. | 430/190 |

FOREIGN PATENT DOCUMENTS

| | | | |
|---|---|---|---|
| 49-29685 | 8/1974 | Japan | 430/190 |
| 739654 | 11/1955 | United Kingdom | |
| 935250 | 8/1963 | United Kingdom | |
| 1329888 | 9/1973 | United Kingdom | 430/190 |

OTHER PUBLICATIONS

Chemical Abstracts, vol. 70, #78637, 1969, (Fedorov et al.).
Fredericks, E. C. et al., *IBM Tech. Discl. Bulletin*, vol. 19, No. 11, p. 4193, 4/1977.

*Primary Examiner*—Charles L. Bowers, Jr.
*Attorney, Agent, or Firm*—Schwartz, Jeffery, Schwaab, Mack, Blumenthal & Koch

[57] ABSTRACT

A light-sensitive composition, especially suitable for preparation of planographic printing plates, comprising a water-insoluble resinous binder which is soluble or swellable in aqueous alkaline solutions, and a naphthoquinonediazide sulfonic acid ester of the general formula I

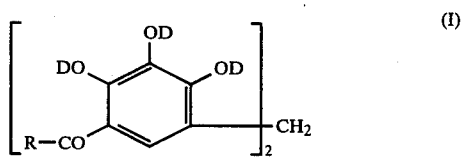

wherein D represents a 1,2-naphthoquinone-2-diazide-4-sulfonyl or 1,2-naphthoquinone-2-diazide-5-sulfonyl radical and R represents an alkyl or aryl radical. Printing plates produced with such compositions exhibit good resistance to aqueous alkaline developers, alcohol-containing moistening liquids and gasoline hydrocarbons.

35 Claims, No Drawings

LIGHT-SENSITIVE MIXTURE COMPRISING O-NAPHTHOQUINONE-DIAZIDES AND LIGHT SENSITIVE COPYING MATERIAL PREPARED THEREFROM

BACKGROUND OF THE INVENTION

The invention relates to a positive-action light-sensitive mixture comprising a water-insoluble resinous binder, which is soluble or swellable in aqueous alkaline solutions, and a light-sensitive 1,2-naphthoquinone-diazidesulfonic acid ester of a trihydroxy-phenylketone. Such compositions are particularly suitable for production of planographic printing plates.

Light-sensitive compounds of this general type are disclosed in German Pat. No. 938,233 and U.S. Pat. No. 3,802,885. They are dihydroxybenzophenones or trihydroxybenzophenones which are partially or completely esterified with naphthoquinonediazidesulfonic acids. Recently, the art has evidenced a preference for completely esterified compounds, which no longer contain any free phenolic OH groups. These compounds have relatively high light sensitivity and give long printing runs, but they have the disadvantage that for some purposes their solubility in the organic solvents usually employed for the coating of printing plates, such as glycol partial ethers or carboxylic acid alkyl esters (e.g. butyl acetate), is too low. Furthermore, used in combination with the preferred binders, for example novolaks, which are soluble in aqueous alkaline solvents, they give layers which in the unexposed state are not sufficiently resistant to conventional alkaline developer solutions. These layers are also attacked to a certain extent during printing in offset printing machines, if alcohol-containing fountain solutions are used. Moreover, they are sensitive to gasoline hydrocarbons frequently used during printing to wash the oleophilic printing ink off the plate.

German Pat. No. 1,118,606 discloses naphthoquinone-diazidesulfonic acid esters of phenolic compounds having a somewhat different basic structure, for example esters of diphenylmethane derivatives. These esters also always contain at least one free hydroxyl group.

SUMMARY OF THE INVENTION

It is an object of the present invention to provide a light-sensitive composition suitable for the production of printing plates and other uses.

Another object of the present invention is to provide a light-sensitive composition which exhibits a high solubility in organic solvents used as coating media.

It is also an object of the present invention to provide a light-sensitive composition which exhibits outstanding resistance to conventional alkaline developers.

Another object of the present invention is to provide a light-sensitive composition which is resistant to the action of alcoholic moistening liquids or gasoline hydrocarbon-containing cleaning agents.

A further object of the present invention is to provide a light-sensitive composition which exhibits outstanding oleophilicity.

A still further object of the present invention is to provide a light-sensitive composition which is compatible with conventional ingredients used in light-sensitive coatings for printing plates.

An additional object of the present invention is to provide a light-sensitive composition which adheres strongly to a substrate upon which it is coated.

Another object of the present invention is to provide a light-sensitive composition which exhibits a harder gradation.

It is also an object of the present invention to provide a light-sensitive composition which is extremely durable.

Yet another object of the present invention is to provide improved light-sensitive, positive-action printing plates.

These and other objects of the invention are achieved by providing a light-sensitive mixture comprising a water-insoluble resinous binder which is soluble or swellable in aqueous alkaline solutions and a naphthoquinone diazide-sulfonic acid ester having the formula

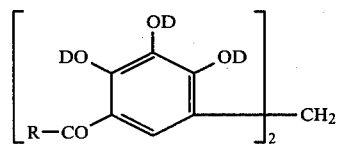

wherein D represents a radical selected from the group consisting of 1,2-naphthoquinone-2-diazide-4-sulfonyl radicals and 1,2-naphthoquinone-2-diazide-5-sulfonyl radicals and R represents a radical selected from the group consisting of alkyl radicals and aryl radicals.

The objects of the invention are further achieved by providing a light-sensitive copying material comprising a support and a light-sensitive coating on said support; said coating comprising a water-insoluble resinous binder which is soluble or swellable in aqueous alkaline solutions and a naphthoquinone diazidesulfonic acid ester corresponding to the formula:

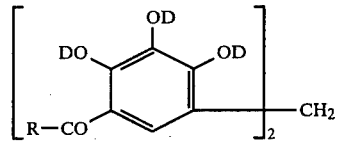

wherein D represents a radical selected from the group consisting of 1,2-naphthoquinone-2-diazide-4-sulfonyl radicals and 1,2-naphoquinone-2-diazide-5-sulfonyl radicals.

DETAILED DESCRIPTION OF PREFERRED EMBODIMENTS

The composition of the invention comprises a naphthoquinone-diazidesulfonic acid ester of the general formula I

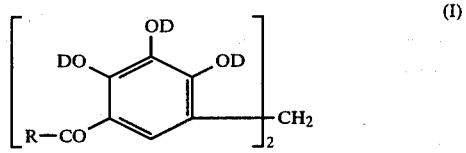

wherein D represents a 1,2-naphthoquinone-2-diazide-4-sulfonyl or 1,2-naphthoquinone-2-diazide-5-sufonyl radical and R represents an alkyl or aryl radical. Compounds in which D represents a 1-2-naphthoquinone-2-diazide-5-sulfonic acid ester group are preferred.

The alkyl radicals R can be straight-chain or branched and can optionally be substituted with halogen atoms or lower alkoxy groups containing up to 4 carbon atoms. Preferably, the alkyl radicals contain 1 to 20 carbon atoms. The aryl radicals R are preferably mononuclear and can be substituted with lower alkyl or alkoxy groups containing up to 4 carbon atoms or with halogen atoms. Preferably the aryl groups contain 6 to 10 carbon atoms. Compounds in which R is an aryl radical are particularly preferred, and compounds in which the aryl radical is a phenyl radical are especially preferred.

Compositions of the invention exhibit high light-sensitivity, good resistance to developer and good adhesion to printing plate layer supports. Furthermore, the inventive compositions exhibit a high resistance to alcohol-containing moistening liquids and to gasoline hydrocarbons.

The quinonediazides contained in the composition of the invention are novel compounds. They are prepared analogously to known processes by esterifying the phenolic hydroxyl groups of the base compound with o-quinonediazidesulfonic acids or their reactive derivatives, for example the sulfonic acid chlorides.

The corresponding starting materials, namely the bis-(3-acyl-4,5,6-trihydroxyphenyl)-methanes, are obtained in good yield by reacting the corresponding 4-acyl-pyrogallols with an aqueous formaldehyde solution (38% strength by weight) at 80° to 100° C. The reaction is effected in the presence of acidic catalysts, such as hydrochloric acid, oxalic acid or p-toluenesulfonic acid. If necessary, an organic solvent, such as ethanol or dioxane, is added in order to dissolve the compounds.

Illustrative starting materials prepared according to the foregoing procedure are listed in the following table. The solvent from which the compound was recrystallized is given in parentheses after the melting point.

| R | Melting point (°C.) |
|---|---|
| $C_6H_5$ | 225 (methanol) |
| $CH_3$ | 252 (ethanol) |
| $CH_3CH_2$ | 233 (ethanol) |
| $CH_3CH_2CH_2$ | 180 (methanol) |
| $CH_3(CH_2)_{16}$ | 138 (ethanol) |
| $CH_3(CH_2)_4$ | 170 (methanol) |
| $CH_3(CH_2)_8$ | 146 (methanol) |

The concentration of the novel naphthoquinone-diazidesulfonic acid esters in the light-sensitive layer may vary within relatively wide limits. In general, the proportion of light-sensitive ester comprises from about 3 to 50 weight percent, preferably from about 7 to 25 weight percent, relative to the solids content of the light-sensitive mixture.

The light-sensitive compositions of the invention further comprise a polymeric, water-insoluble resinous binder which dissolves in the solvents used for the composition of the invention and is also soluble or at least swellable in aqueous alkali.

The novolac condensation resins which have proved their value in numerous naphthoquinonediazide-containing positive copying materials have also been found to be particularly useful and advantageous as additives in the compositions of the invention containing the novel naphthoquinonediazide sulfonic acid esters. They enhance the strong contrast between the exposed and unexposed portions of the coating upon development. This is particularly true of the relatively highly condensed resins formed by condensing substituted phenols, such as cresols, with formaldehyde. Further examples of alkali-soluble or alkali-swellable binders include natural resins, such as shellac and rosin, and synthetic resins, such as copolymers of styrene and maleic anhydride or copolymers of acrylic acid or methacrylic acid, especially with acrylic acid esters or methacrylic acid esters.

The nature and quantity of the alkali-soluble resin can vary according to the end use. Preferably, the alkali-soluble resin constitutes between 50 and 95 weight percent, most preferably between 65 and 90 weight percent, of the total solids content of the composition. Furthermore, numerous other resins can additionally be incorporated in the compositions. Preferable additional resins include epoxides and vinyl polymers, such as polyvinyl acetates, polyacrylates, polyvinyl acetals, polyvinyl ethers, polyvinylpyrrolidones and the copolymers of the monomers on which these resins are based. The most advantageous content of these resins depends on the technical requirements imposed by the intended use, and on the effect on the development conditions. In general, the content of additional resin will be not more than 20% of the weight of the alkali-soluble resin. For special requirements, such as flexiblity, adhesion, gloss, coloration and color change etc., the light-sensitive mixture can also contain small amounts of substances such as polyglycols, cellulose derivatives (e.g. ethylcellulose), wetting agents, dyes, adhesion promoters and finely divided pigments. Ultraviolet absorbers may also be included in the compositions, if desired.

For the coating of a suitable substrate, the compositions are generally dissolved in a solvent. The choice of solvent depends on the intended coating process, the desired coating thicknesses and the drying conditions. Suitable solvents for the composition of the invention include ketones (e.g. methyl ethyl ketone), chlorinated hydrocarbons (e.g. trichloroethylene and 1,1,1-trichloroethane), alcohols (e.g. n-propanol), ethers (e.g. tetrahydrofuran), alcohol-ethers (e.g. ethylene glycol monoethyl ether), and esters (e.g. butyl acetate). Mixtures of solvents may also be used. For special purposes, solvent mixtures containing acetonitrile, dioxane or dimethylformamide may be useful. In principle, all solvents which do not react irreversibly with the components of the coating can be used. Partial ethers of glycols, especially ethylene glycol monomethyl ether, are particularly preferred.

In most cases, metals are used as the substrates or supports for coatings having a thickness of less than about 10 μm. Substrates for offset printing plates may be made from bright-rolled, mechanically or electrochemically roughened aluminum which may also be anodized, if desired. Use can also be made of aluminum substrates which have been pretreated chemically, for example with polyvinylphosphonic acid, silicates, phosphates, hexafluosilicates or hydrolyzed tetraethyl orthosilicate. Multi-metal plates, for example of Al/Cu/Cr or of brass/chromium, may also be used as substrates. For the preparation of letterpress plates, compositions according to the invention may be applied to zinc or magnesium plates or to commercially available microcrystalline alloys of these metals for single-stage etching processes. Additionally, the compositions may be applied to etchable synthetic materials such as polyoxymethylene. Due to their good adhesion and etch resistance on copper and nickel surfaces, the compositions of the invention are suitable for gravure printing forms or screen-printing forms. Likewise, the compositions of the invention can be used as photoresists in the manufacture of printed circuit boards and in chemical milling.

In further applications, other supports, such as wood, paper, ceramics, textiles and other metals can also be used.

The preferred substrates for coatings having thicknesses of more than 10 μm are plastic films, which then serve as a temporary substrate for transfer layers. For this purpose, and for color-test films, it is preferred to use polyester films, for example films of polyethylene terephthalate. However, polyolefin films, such as polypropylene, are also suitable.

The coating of the support material is effected in a known manner by spin-coating, spraying, dipping or rolling, by application through slot dies (extruding) or by knife-coating (doctoring), or by means of a casting applicator. Finally, the coating of, for example, printed circuit boards, glass or ceramic and silicon chips can also be effected by layer transfer from a temporary support.

The usual light sources customary in industry are used for exposure. Irradiation with electrons or lasers also represents possible ways of image formation.

The areas of the copying layer which have been struck by light are removed by aqueous alkaline developer solutions of graded alkalinity to produce a positive image of the original. Preferably the developer solutions have a pH in the range of 10 to 14. The developer solutions may also contain minor amounts of organic solvents or wetting agents.

Preferred uses of the light-sensitive compositions of the invention include the preparation of printing plates, particularly offset printing plates, autotype gravure printing plates and screen printing plates, as well as production of photoresist solutions and so-called dry resists.

Printing plates produced using the novel compounds have a high practical light-sensitivity, as well as improved resistance to alkaline developers and to those organic solvents which are usually employed in copier processes or on printing machines during the printing process. The preferred compounds themselves exhibit good solubilitty in the customary solvents, a highly oleophilic character and good compatibility with the other constituents of the copying layer.

The invention will be explained in greater detail with reference to the following examples wherein parts by weight and parts by volume bear the same relation to one another as grams to cubic centimeters. Unless otherwise stated, percentages refer to percentages by weight, and parts refer to parts by weight.

EXAMPLE 1

An electrochemically roughened, anodized aluminum plate bearing an oxide weight of 3 g/m² was coated with a solution of
  1.10 parts of the product obtained by esterification of 1 mole of bis-(3-benzoyl-4,5,6-trihydroxyphenyl)-methane with 6 moles of 1,2-naphthoquinone-2-diazide-5-sulfonic acid chloride,
  6.00 parts of a cresol-formaldehyde novolak having a softening point of 105°–120° C.,
  0.12 part of 4-(p-tolylmercapto)-2,5-diethoxybenzenediazonium hexafluophosphate and
  0.06 part of crystal violet (C.I. 42,555) in
  40 parts of ethylene glycol monomethyl ether and
  50 parts of tetrahydrofuran.

Before application of the light-sensitive copying layer, the anodized aluminum substrate was treated with an aqueous solution of polyvinylphosphonic cid, as described in German Pat. No. 1,621,478.

The weight of the resulting light-sensitive coating was 2.30 g/m². The light-sensitive material was exposed imagewise through a transparent positive original to produce an image which wa then developed using the following solution:
  5.3 parts of sodium metasilicate×9 water,
  3.4 parts of trisodium phosphate×12 water and
  0.3 part of anhydrous sodium dihydrogen phosphate in
  91.0 parts of water.

The portions of the copying layer struck by the light were removed by the development, and the unexposed image areas remained on the substrate, so that a printing plate corresponding to the original was obtained. About 250,000 perfect prints were obtained on an offset printing machine from the printing plate. The printing plate exhibited excellent resistance to developer and adhesion to the substrate. Furthermore, the resistance of the copying layer to certain organic solvents such as alcohol-containing moistening liquids or gasoline-containing cleaning agents, which are used on the printing machines during the printing process, was also remarkably good.

The following examples describe additional coating solutions with which similar results have been obtained. Unless stated otherwise, the preparation and processing of the printing plates made with these solutions is effected according to the procedures described in Example 1.

EXAMPLE 2

An aluminum plate, pretreated as described in Example 1, was coated with a solution of
  1.00 part of the product of esterification of 1 mole of bis-(3-acetyl-4,5,6-trihydroxy-phenyl)methane with 6 moles of 1,2-naphthoquinone-2-diazide-5-sulfonic acid chloride,
  6.10 parts of the novolak resin used in Example 1,
  0.15 part of polyvinylbutyral (comprising 69–71% vinylbutyral units, about 1% vinyl acetate units and 24–27% vinyl alcohol units),
  0.06 part of Sudan Yellow GGN (C.I. 11,021) and
  0.06 part of crystal violet in
  45 parts of ethylene glycol monomethyl ether and
  50 parts of tetrahydrofuran.

The resulting presensitized printing plate was exposed imagewise through a transparent positive original to produce an image which then was developed with the developer solution described in Example 1. The developer resistance of the unexposed areas of the layer and the resistance to alcohol-containing moistening liquid were very good.

If the indicated naphthoquinonediazide sulfonic acid ester in the coating solution was replaced with an equal amount of an analogous esterification product obtained from bis(3-propionyl-4,5,6-trihydroxyphenyl)-methane or from bis-(3-butyryl-4,5,6-trihydroxylphenyl)-methane, printing plates having comparable properties were obtained.

EXAMPLE 3

An electrochemically roughened, anodized aluminum plate bearing an oxide weight of 3.0 g/m² was coated with a solution of:
- 1.00 part of the product formed by esterifying bis-(3-octadecanoyl-4,5,6-trihydroxyphenyl)methane with 6 moles of 1,2-naphthoquinone-2-diazide-5-sulfonic acid chloride,
- 6.10 parts of the novolak used in Example 1,
- 0.10 part of 1,2-naphthoquinone-2-diazide-4-sulfonic acid chloride and
- 0.06 part of crystal violet in
- 45 parts of ethylene glycol monomethyl ether and
- 50 parts of tetrahydrofuran.

The resulting light-sensitive printing plate was exposed imagewise under a transparent positive original and was developed with the developer solution described in Example 1.

Printing plates having comparable properties were obtained if the light-sensitive compound in the coating solution was replaced by an equal amount of the corresponding esterification product of 1,2-naphthoquinone-2-diazide-5-sulfonic acid chloride and bis-(3-decanoyl-4,5,6-trihydroxyphenyl)-methane or bis-(3-hexanoyl-4,5,6-trihydroxyphenyl)-methane.

The foregoing embodiments of the invention have been set forth merely as illustrative examples of the invention and are not intended to be limiting. Since modifications of the described embodiments incorporating the spirit and substance of the invention may occur to persons skilled in the art, the scope of the invention is to be limited solely with respect to the appended claims and equivalents.

I claim:

1. A light-sensitive composition comprising a water-insoluble resinous binder which is soluble or swellable in aqueous alkaline solutions and a naphthoquinonediazide-sulfonic acid ester corresponding to the formula I

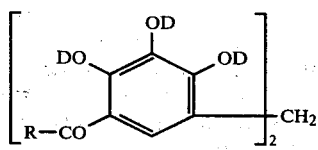

wherein D represents a radical selected from the group consisting of 1,2-naphthoquinone-2-diazide-4-sulfonyl radicals and 1,2-naphthoquinone-2diazide-5-sulfonyl radicals and R represents a radical selected from the group consisting of alkyl radicals and aryl radicals.

2. A light-sensitive composition according to claim 1 wherein said resinous binder comprises a phenolic resin novolak.

3. A light-sensitive composition according to claim 1 wherein said naphthoquinonediazide-sulfonic acid ester comprises from about 3 to about 50 weight percent of the solids content of said composition.

4. A composition according to claim 3 wherein said naphthoquinonendiazide sulfonic acid ester comprises from about 7 to about 25 weight percent of the solids content of said composition.

5. A composition according to claim 1 wherein said alkyl radicals comprise straight chain or branched radicals containing from 1 to 20 carbon atoms.

6. A composition according to claim 5 wherein said alkyl radicals are substituted with at least one substituent selected from the group consisting of halogen atoms and lower alkoxy radicals.

7. A composition according to claim 1 wherein said aryl radicals comprise mononuclear aryl groups containing from 6 to 10 carbon atoms.

8. A composition according to claim 7 wherein said aryl radicals are substituted with at least one substituent selected from the group consisting of halogen atoms, lower alkyl groups and lower alkoxy groups.

9. A composition according to claim 1 wherein R represents a phenyl radical.

10. A composition according to claim 1 wherein said resinous binder comprises a condensation product of a substituted phenol and formaldehyde.

11. A composition according to claim 1 wherein said resinous binder comprises a natural resin selected from the group consisting of shellac and rosin.

12. A composition according to claim 1 wherein said resinous binder comprises a synthetic resin selected from the group consisting of copolymers of styrene and maleic anhydride, copolymers of acrylic acid with acrylate esters, and copolymers of methacrylic acid with acrylate esters.

13. A composition according to claim 1 wherein said resinous binder comprises from about 50 to 95 weight percent of the solids content of said composition.

14. A composition according to claim 13 wherein said resinous binder comprises from about 65 to 90 weight percent of the solids content of said composition.

15. A composition according to claim 1 further comprising an additional resin selected from the group consisting of epoxides and vinyl polymers; said additional resin being present in an amount up to about 20 percent of the weight of said resinous binder.

16. A light-sensitive composition according to claim 1 further comprising at least one conventional additive selected from the group consisting of polyglycols, cellulose derivatives, wetting agents, dyes, adhesion promotors, finely divided pigments, and ultraviolet absorbors.

17. An organic solvent solution of a composition according to claim 1.

18. A composition according to claim 17 wherein said organic solvent is selected from the group consisting of ketones, chlorinated hydrocarbons, alcohols ethers, alcohol-ethers, and esters.

19. A composition according to claim 18 wherein said solvent is selected from the group consisting of methyl ethyl ketone, trichloroethylene, 1,1,1-trichloroethylene, n-propanol, tetrahydrofuran, ethylene glycol monoethyl ether, ethylene glycol monomethyl ether, butyl acetate and mixtures of one or more of the foregoing.

20. A composition according to claim 17 wherein said organic solvent comprises a solvent mixture comprising at least one solvent selected from the group consisting of acetonitrile, dioxane, and dimethylformamide.

21. A composition according to claim 17 wherein said organic solvent comprises ethylene glycol monomethyl ether.

22. A composition according to claim 1 wherein D represents a 1,2-naphthoquinone-2-diazide-5-sulfonyl radical.

23. A light-sensitive material comprising a support and a light-sensitive coating on said support; said coating comprising a water-insoluble resinous binder which is soluble or swellable in aqueous alkaline solutions and a naphthoquinonediazide sulfonic acid ester corresponding to the formula I

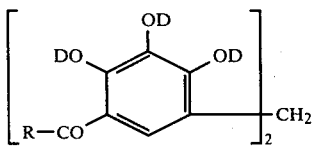

wherein D represents a radical selected from the group consisting of 1,2-naphthoquinone-2-diazide-4-sulfonyl radicals and 1,2-naphthoquinone-2-diazide-5-sulfonyl radicals and R represents a radical selected from the group consisting of alkyl radicals and aryl radicals.

24. A material according to claim 23 wherein said support comprises a material selected from the group consisting of wood, paper, ceramic, textile, metal sheets, and synthetic polymer films.

25. A material according to claim 23 wherein said support comprises a plate of metal selected from the group consisting of aluminum, aluminum/copper/chromium, brass/chromium, zinc, magnesium, copper, and nickel.

26. A material according to claim 23 wherein said support comprises a film of synthetic polymer selected from the group consisting of polyethylene terephthalate and polyproplyene.

27. A material according to claim 23 wherein said substrate comprises an electrochemically roughened anodized aluminum plate.

28. A material according to claim 23 wherein said support is a metal plate and said light-sensitive coating has a thickness not greater than about 10 μm.

29. A material according to claim 23 wherein said support is a synthetic polymer film and said coating has a thickness of at least 10 m.

30. A light-sensitive compound of the formula I

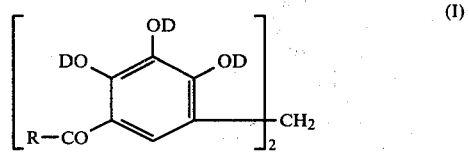

wherein D represents a radical selected from the group consisting of 1,2-naphthoquinone-2-diazide-4-sulfonyl radicals and 1,2-naphthoquinone-2-diazide-5-sulfonyl radicals and R represents a radical selected from the group consisting of alkyl radicals and aryl radicals.

31. A compound according to claim 30 wherein said alkyl radicals comprise straight chain or branched radicals containing from 1 to 20 carbon atoms.

32. A compound according to claim 31 wherein said alkyl radicals are substituted with at least one substituent selected from the group consisting of halogen atoms and lower alkoxy radicals.

33. A compound according to claim 30 wherein said aryl radicals comprise mononuclear aryl group containing from 6 to 10 carbon atoms.

34. A compound according to claim 33 wherein said aryl radicals are substituted with at least one substituent selected from the group consisting of halogen atoms, lower alkyl groups and lower alkoxy groups.

35. A compound according to claim 30 wherein R represents a phenyl radical.

* * * * *

UNITED STATES PATENT AND TRADEMARK OFFICE
CERTIFICATE OF CORRECTION

PATENT NO. : 4,407,926
DATED : October 4, 1983
INVENTOR(S) : Paul STAHLHOFEN

It is certified that error appears in the above-identified patent and that said Letters Patent is hereby corrected as shown below:

IN THE CLAIMS:

Claim 18, Column 8, line 45, kindly insert a comma between "alcohols" and "ethers".

Claim 29, Column 10, line 3, kindly insert -- µ -- between "10" and "m".

Claim 33, Column 10, line 26, kindly delete "group" and insert instead -- groups --.

Signed and Sealed this

Sixth Day of March 1984

[SEAL]

Attest:

GERALD J. MOSSINGHOFF

Attesting Officer

Commissioner of Patents and Trademarks